United States Patent
Sundararajan et al.

(10) Patent No.: US 6,593,653 B2
(45) Date of Patent: *Jul. 15, 2003

(54) LOW LEAKAGE CURRENT SILICON CARBONITRIDE PREPARED USING METHANE, AMMONIA AND SILANE FOR COPPER DIFFUSION BARRIER, ETCHSTOP AND PASSIVATION APPLICATIONS

(75) Inventors: Srinivasan Sundararajan, Sunnyvale, CA (US); Mayur Trivedi, Fremont, CA (US)

(73) Assignee: Novellus Systems, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 140 days.

(21) Appl. No.: 09/409,185

(22) Filed: Sep. 30, 1999

(65) Prior Publication Data

US 2002/0027286 A1 Mar. 7, 2002

(51) Int. Cl.$^7$ .......................... H01L 23/48; H01L 23/52; H01L 29/40
(52) U.S. Cl. ................. 257/751; 257/758; 257/762; 257/767
(58) Field of Search ................... 257/751, 752, 257/758, 762, 767, 774, 632, 635, 750, 759; 438/627, 622, 623

(56) References Cited

U.S. PATENT DOCUMENTS

| | | | |
|---|---|---|---|
| 5,290,354 A | * 3/1994 | Haluska | 106/479 |
| 5,318,857 A | * 6/1994 | Haluska | 428/552 |
| 5,693,565 A | * 12/1997 | Camilletti et al. | 438/17 |
| 5,818,071 A | 10/1998 | Loboda et al. | |
| 6,251,770 B1 | * 6/2001 | Uglow et al. | 438/624 |
| 6,340,435 B1 | * 1/2002 | Bjorkman et al. | 216/72 |

FOREIGN PATENT DOCUMENTS

EP 0771886 A1 7/1997 ........... C23C/16/36

OTHER PUBLICATIONS

Scott Meikle, Yoshiko Suzuki, and Yoshinori Hatanaka, The Role of Hydrogen Dilution in Deposition of a–SiC:H from Silane/ethylene Mixtures, J. Appl. Phys. vol. 67 No. 2, Jan. 15, 1990, pp. 1048–1050.

Sadaji Tsuge, et al., "Improvement In Wide–Gap A–Si:H for High–Efficiency Solar Cells", pp. 1048 & 1050 Functional Materials Research Center, Sanyo Electric Co., Ltd., Osaka Japan, 1992; C.C. Tsai, "Characterization of Amorphous Semiconducting Silcion–boron Alloys Prepared by Plasma Decomposition", Physical Review B, vol. 19, No. 4, Feb. 15, 1979. pp. 2053–2054.

D. Girginoudi and A. Thanailakis, "The Effect of Hydrogen Content on the Optoelectric Properties of Amorphous Silicon–carbide Films", pp. 1490 & 1492; J. Appl. Phys. vol. 69, No. 3; Feb. 1, 1991.

(List continued on next page.)

*Primary Examiner*—Shouxiang Hu
(74) *Attorney, Agent, or Firm*—Skjerven Morrill LLP

(57) ABSTRACT

A silicon carbon nitride (SiCN) layer is provided which has a low leakage current and is effective in preventing the migration or diffusion of metal or copper atoms through the SiCN layer. The SiCN layer can be used as a diffusion barrier between a metal portion (such as a copper line or via) and an insulating dielectric to prevent metal atom diffusion into the dielectric. The SiCN layer can also be used as an etchstop or passivation layer. The SiCN layer can be applied in a variety ways, including PECVD (e.g., using $SiH_4$, $CH_4$, and $NH_3$) and HDP CVD (e.g., using $SiH_4$, $C_2H_2$, and $N_2$)

16 Claims, 3 Drawing Sheets

OTHER PUBLICATIONS

Ping Xu, et al., "BLOk™—A Low–k Dielectric Barrier/Etch Stop Film for Copper Damascene Applications", Interconnect Tech., IEEE, 1999, pp. 109–111.

C.C. Tsai, "Characterization of amorphous semiconducting silicon–boron alloys prepared by plasma decomposition" The American Physical Society 1979, vol. 19, No. 4, pp.19–21.

S. W. Rynders, A. Scheeline, and P. W. Bohn "Structure evolution in a–SiC:H films prepared from tetramethylsilane", J.Appl. Phys., 1991 American Institute of Pysics, pp. 2951–2959.

B. Goldstein and C.R. Dickson, "Properties of p+ microcrystalline films of SiC:H deposited by conventional rf glow discharge", Appl. Phys. Left. 53, Dec. 26, 1988, pp. 2672–2674.

Motoharu Yamazaki, Jun–ichi Nakata, Shozo Imao, Junji Shirafuji and Yoshio Inuishi, "A C Conductivity of Undoped a–Si:H and $\mu$ C–Si:H in Connection with Morphology and Optical Degradation" Japanese Journal of Applied Physics, vol. 28, No. 4, Apr. 1989, pp. 577–585.

\* cited by examiner

US 6,593,653 B2

LOW LEAKAGE CURRENT SILICON CARBONITRIDE PREPARED USING METHANE, AMMONIA AND SILANE FOR COPPER DIFFUSION BARRIER, ETCHSTOP AND PASSIVATION APPLICATIONS

BACKGROUND OF THE INVENTION

1. Field of the Invention

The present invention relates to layers in semiconductor devices, and, in particular, to metal barrier diffusion layers.

2. Discussion of the Related Art

Integrated circuits fabricated on semiconductor substrates for very large scale integration typically require multiple levels of metal layers to electrically interconnect the discrete layers of semiconductor devices on the semiconductor chips. The different levels of metal layers are separated by various insulating or dielectric layers (also known as interlevel dielectric (ILD) layers), which have etched via holes to connect devices or active regions from one layer of metal to the next.

As semiconductor technology advances, circuit elements and dimensions on wafers or silicon substrates are becoming increasingly more dense. Consequently, the interconnections between various circuit elements and dielectric layers needs to be as small as possible. One way to reduce the size of interconnection lines and vias is to use copper (Cu) as the interconnect material instead of conventionally used materials such as aluminum (Al). Because copper has a conductivity approximately twice that of aluminum, the number of metal layers required will be less.

However, the use of copper as the interconnect material presents various problems. For example, there is currently no production-worthy etch process for Cu. This necessitates the use of a dual damascene "inlaid" approach. In the dual damascene approach, a dielectric or insulating diffusion barrier layer is deposited over a copper layer. The dielectric layer is then patterned, e.g., by conventional masking and etching techniques, to form a two-step connection having a narrower lower portion (or via portion) exposing desired connection areas on the underlying patterned metal layer and a wider upper portion (or trench portion) that will form the next layer of metal lines. The trench portion can be formed first or the via portion can be formed first (e.g., completely etching the dielectric layer down to the semiconductor substrate). Copper is then deposited to fill the two-step connection, such as by an "electrofill (electrochemical deposition)" process. The copper is then removed, e.g., by a chemical mechanical polish (CMP) process. The resulting structure is a via (the filled via portion) connecting the desired areas in the underlying metal layer with an overlying copper line (the filled trench portion).

In the dual damascene approach, the contact to the devices in the semiconductor substrate is usually made with Tungsten (W) plugs. Copper (Cu) can be used for subsequent metal layers. There could be variations in this regard with some manufacturers using Cu for some layers and Al for the others. However, when Cu is used, the copper atoms must be prevented from migrating or diffusing into adjacent dielectric oxide or other inter-layer dielectric layers, which can compromise their integrity as an insulator. Thus, when using Cu, a dielectric diffusion barrier (DDB) is typically formed between the top of the Cu metal line or layer and a subsequently deposited ILD layer to prevent copper atom migration into the ILD layer. The ILD layer is then etched to define a via and a next level of copper lines. The two-step connection for the via and line can be formed using, e.g., a "timed" etch or an etchstop layer. A timed etch approach partially etches the ILD first. The etchstop approach utilizes an etchstop layer separating the ILD layer between the via and line. So the stack of the ILD would have a ILD layer (via level) followed by an etchstop layer at the desired height followed by an ILD layer (line level) on the etchstop layer. The via hole is defined first by photolithography. The vias are just vertical interconnections between a line above and a line below. So, when the lines are defined, we do not want the etch to continue below the desired vertical height. The etchstop layer precisely defines the line by not allowing etching beyond the etchstop layer.

Once the etching is done, Tantalum (Ta) or Tantalum Nitride (TaN) followed by a Cu seed layer is deposited, i.e. by PVD. This is followed by a fill of the line and the via hole with electrochemical deposition of Cu, such as using a process called electrofill by those skilled in the art. Excess copper is then removed by a Cu CMP step. Once the CMP step is completed, it is followed by CuOx reduction step and another DDB deposition step. Thus, DDB layers between dielectric layers and metal lines prevent copper atoms from diffusing into the ILD layers.

Typical materials used for the dielectric diffusion barrier are silicon nitride (SiN). Silicon carbide (SiC) is being considered since it can be made with a lower dielectric constant than SiN. For example, a SiC diffusion barrier can be formed using silane ($SiH_4$) and methane ($CH_4$) gases, with the flow rate of $SiH_4$ varying between 100 and 500 sccm and the flow rate of $CH_4$ varying between 9000 and 12000 sccm. The silicon carbide diffusion barrier is effective in preventing the migration of metal or copper atoms between adjacent metal layers. However, because silicon carbide is a semiconductor material, it can also exhibit a high leakage current, e.g., 300 $\mu A/cm^2$ at an electric field strength of $10^6$ V/cm.

Accordingly, a barrier layer is desired that is effective in preventing the migration of metal atoms while also exhibiting low leakage current.

SUMMARY OF THE INVENTION

In accordance with the present invention, a barrier layer is formed with a silicon carbon (or carbo) nitride (SiCN) material. A SiCN barrier layer is effective both in preventing metal atom migration and in reducing leakage current, e.g., a leakage current of 90 $nA/cm^2$ has been measured in a $10^6$ V/cm electric field, compared to a 300 $\mu A/cm^2$ leakage current using a SiC barrier layer.

In one embodiment, the SiCN layer is formed by adding ammonia ($NH_3$) gas to silane ($SiH_4$) and methane ($CH_4$) gas in a plasma enhanced chemical vapor deposition (PECVD) chamber, with flow rates of the $NH_3$ ranging from 500 to 4000 sccm. In other embodiments, the SiCN layer is formed by adding inert gases to methylsilane ($CH_3SiH_3$), dimethylsilane ($CH_3(SiH_2)_2$), trimethylsilane ($CH_3(SiH)_3$), or tetramethylsilane ($Si(CH_3)_4$) in conjunction with $NH_3$. Deposition can be performed in either single station or multi-station PECVD chambers. The SiCN layer can also be formed using a high density plasma (HDP) deposition process with feed gases of 1) $SiH_4$, $C_2H_2$, and $N_2$ or 2) $SiH_4$, $CH_4$, and $N_2$. Prior to forming the SiCN layer, the underlying metal or copper lines can be cleaned by using hydrogen or ammonia feed gases in PECVD or HDP chambers to remove the copper oxides. When cleaning in a PECVD chamber, the flow rates of $NH_3$ or $H_2$ range between 50 and 8000 sccm or higher, with the HFRF and LFRF power between 50 and 4000 W. When using an HDP chamber, typically flow rates of hydrogen range from 0 to 2000 sccm with a LFRF power range of 500 to 4000 W.

In other embodiments of the present invention, the SiCN layer can be used as an etchstop layer when forming a two-step connection using a dual damascene process. A first dielectric layer is deposited on the copper or metal lines, where the first dielectric layer thickness is approximately the height of the via. After the via is formed, the SiCN layer is deposited and a second dielectric layer is deposited over the SiCN layer. This second dielectric layer is then patterned and etched to form the copper line, thereby resulting in the two-step connection. The SiCN layer prevents the etching of the second dielectric layer to encroach on the first dielectric layer. The SiCN layer can also be used as a passivation layer to prevent scratches to the device.

This invention will be more fully understood in light of the following detailed description taken together with the accompanying drawings.

BRIEF DESCRIPTION OF THE DRAWINGS

Use of the same reference numbers in different figures indicates similar or like elements.

DETAILED DESCRIPTION

In accordance with an embodiment of the present invention, a silicon carbon nitride (SiCN) layer is provided that has a low leakage current and is effective in preventing metal atoms from migrating or diffusing through the SiCN layer. Thus, when compared to conventional silicon carbide (SiC) layers, the SiCN layer, while similarly effective in blocking the migration of metal atoms through the layer, also exhibits a low leakage current, contrary to the high leakage current associated with SiC barrier layers. Thus, the SiCN layer can be used as a diffusion barrier between a metal layer and a dielectric layer to replace the conventional SiC diffusion barrier layer. The SiCN layer can also be used as an etchstop layer, such as in a dual damascene process, or a passivation layer for scratch protection.

Figure 1B:
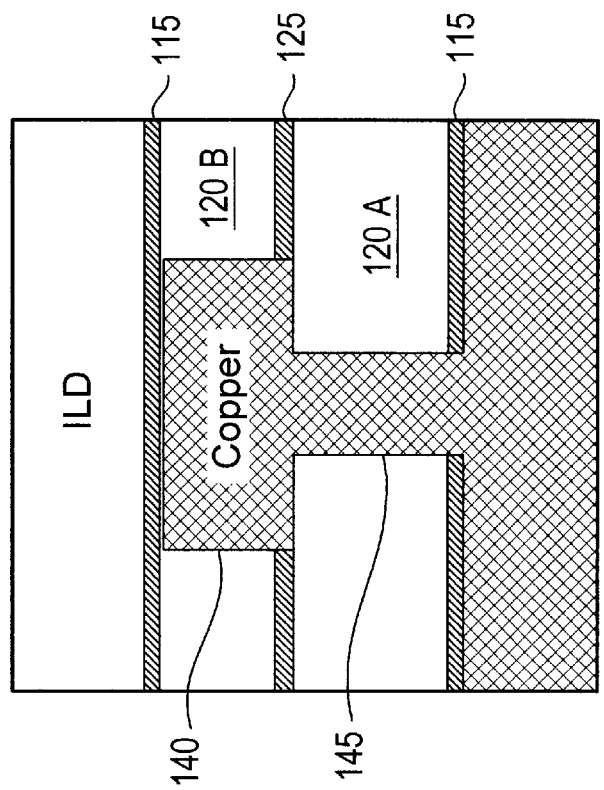
FIG. 1B is a cross-sectional view of a semiconductor device utilizing a silicon carbon nitride (SiCN) layer according to another embodiment of the present invention.
Figure 1A:
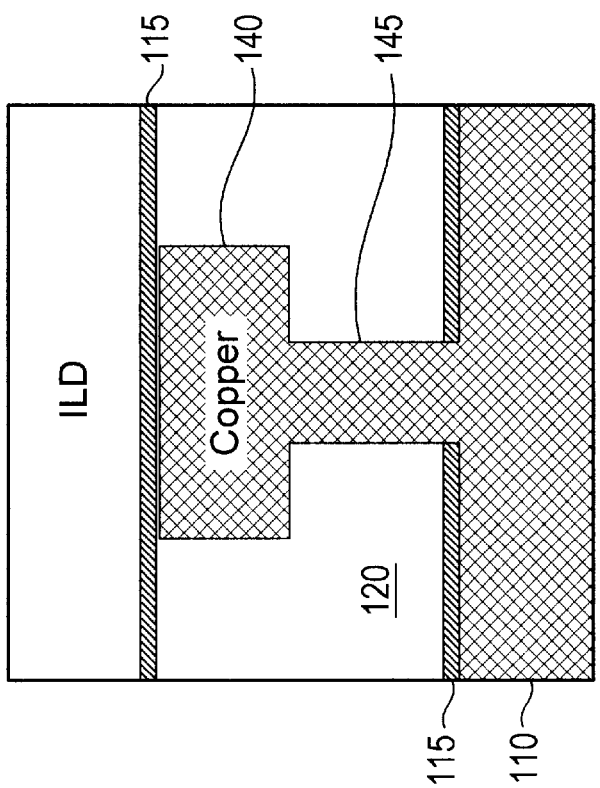
FIG. 1A is a cross-sectional view of a semiconductor device utilizing a silicon carbon nitride (SiCN) layer according to one embodiment of the present invention.

FIG. 1A shows a dual damascene structure in which a SiCN layer can be used, according to one embodiment. A copper (Cu) line 110 is first covered with a silicon carbon (or carbo) nitride SiCN dielectric diffusion barrier (DDB) 115. Before depositing the DDB, the Cu surface can be improved by removing of any copper oxide that may be remaining on the surface. Typically a hydrogen ($H_2$) or an ammonia ($NH_3$) plasma based reduction is used before the deposition of DDB 115. This copper surface reduction to remove CMP residue (e.g., Cu oxide) can be performed in a PECVD or a HDP chamber. Typical gases, flow rates, and powers used in the PECVD chamber are as follows: $NH_3$ or $H_2$ 50–8000 sccm or higher, HFRF power: 50–4000 W, LFRF power: 50–4000 W. In the HDP chamber, typically flow rates of hydrogen is 0–2000 sccm with a LFRF power of 500–4000 W, which can also remove etch residue. This reduction has the benefit of removing CMP residues from the CMP step and the clean that follows.

On top of Cu line 110, the SiCN DDB layer 115 is deposited. After the deposition of DDB layer 115, an interlevel dielectric (ILD) layer 120 is deposited. The thickness of ILD layer 120 is such that both a line and a via can be defined. ILD layer 120 is etched in a two-step etch so that a line 140 and a via 145 can be fabricated in the "inlaid" dual damascene fashion, as is known to those skilled in the art. A "timed" etch can be used to first etch a hole (for the via) and then etch a trench (for the line) in ILD layer 120. The via hole etch also etches the underlying portion of DDB layer 115 to allow metallic contact with the underlying metal line. Alternatively, an "etchstop" layer 125 can be used for etching the hole and trench, as shown in FIG. 1B. A first ILD layer 120A is deposited over DDB layer 115, where the thickness of ILD layer 120A is approximately the height of via 145. ILD layer 120A is patterned and etched to create the via hole. The portion of DDB layer 115 over the via hole is also etched to expose the underlying metal line. A SiCN etchstop layer 125 is deposited over ILD layer 120A, followed by deposition of a second ILD layer 120B, where the thickness of second ILD layer 120B is the depth of line 140. Note that the total thickness of ILD layers 120A and 120B is approximately the same as ILD layer 120 of FIG. 1A. Second ILD layer 120B is then patterned and etched to create the trench. SiCN etchstop layer 125 prevents the etching of second ILD layer 120B from continuing into first ILD layer 120A.

After the etch processes creating the via hole and trench are completed, the next step is the metallic (conductive) diffusion barrier deposition (not shown). Tantalum (Ta) and Tantalum Nitride (TaN) are suitable materials, which are deposited by PVD in the form of a thin layer, e.g., approximately 150 Å thick. Over the Ta or TaN diffusion barrier layer, a Cu seed layer is deposited, typically about 1500 Å thick. The Cu seed is deposited so as to allow electroplated Cu to fill the trench and the via hole without voids. The next step is the electroplating or the electrofill of the trench and the via hole, as is known to those skilled in the art. Once the Cu fill is completed, a desired line 140 and via 145 are formed in the trench and via hole, respectively. The above described process can then be repeated to form a desired multi-level structure. A final SiCN layer can also be deposited as a passivation layer (not shown) for protecting the device from scratching. The SiCN dielectric diffusion barrier (DDB) layer is critical as it effectively prevents copper diffusion into the ILD layers, while exhibiting low leakage current as shown in FIGS. 2A and 2B.

Figure 2A:
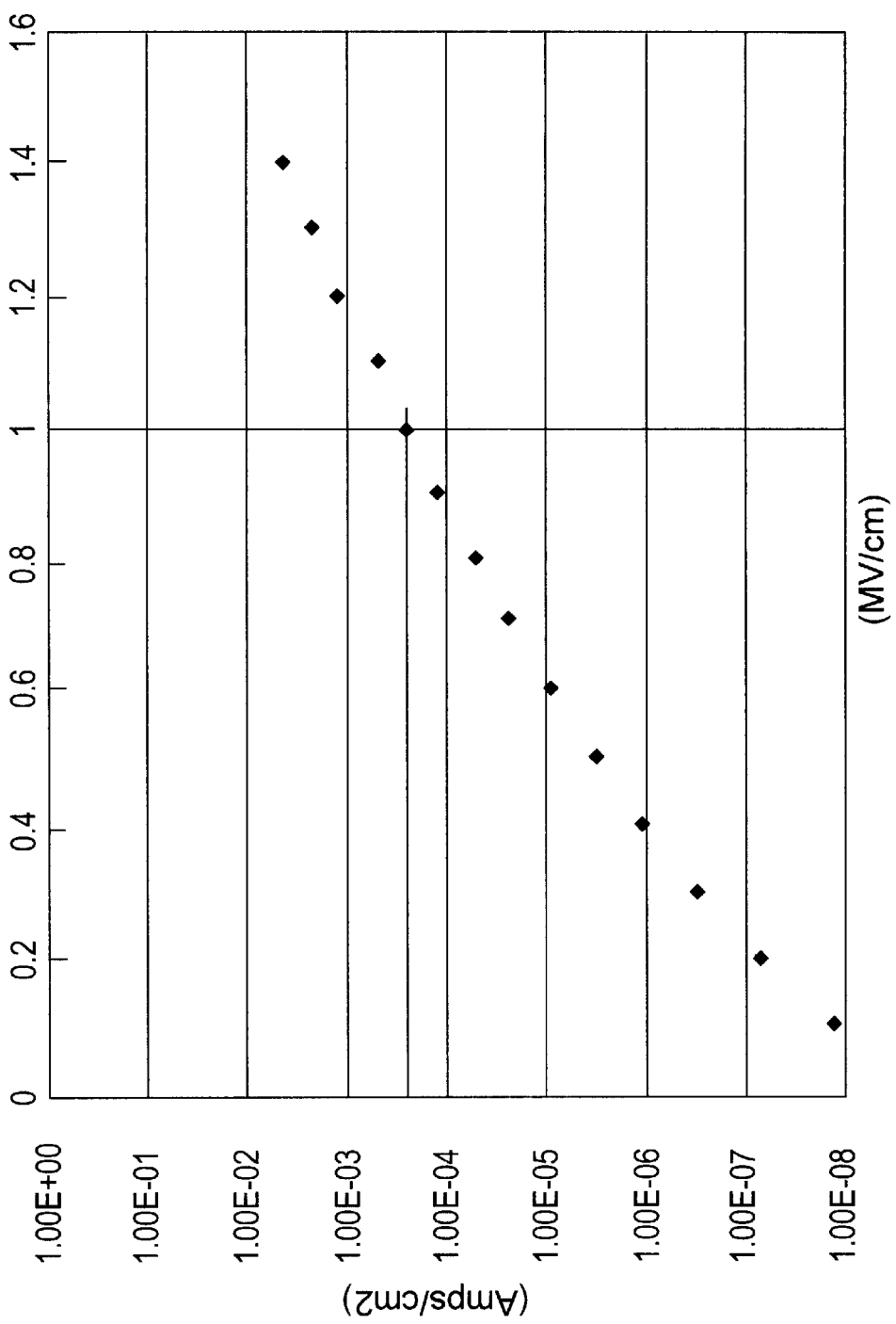
FIG. 2A is a graph of the leakage current as a function of the electric field in a silicon carbide (SiC) layer.
Figure 2B:
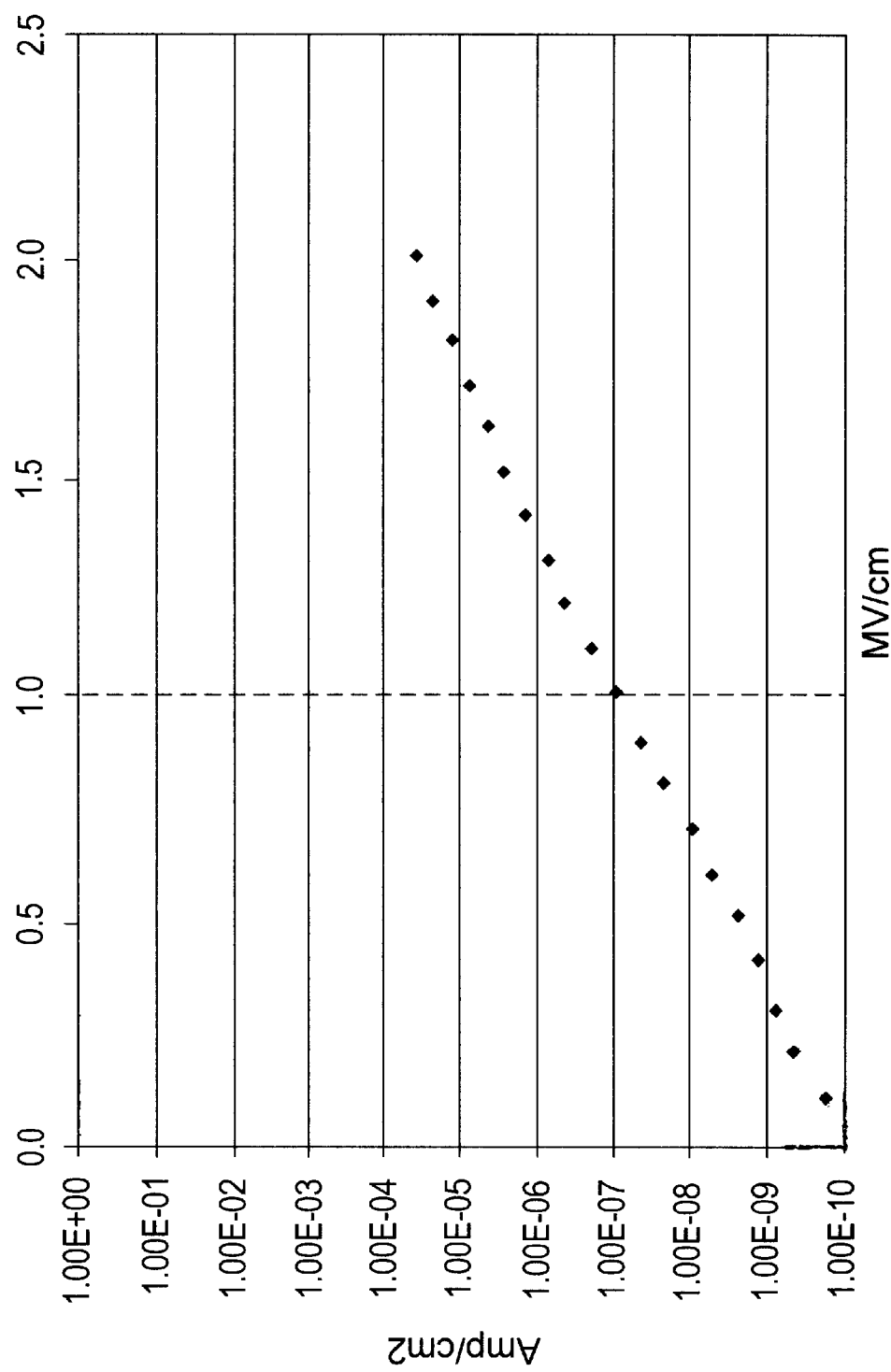
FIG. 2B is a graph of the leakage current as a function of the electric field in a SiCN layer.

FIGS. 2A and 2B are experimental plots showing the leakage current (in units of $A/cm^2$) as a function of the electric field (in units of MV/cm) in a conventional SiC barrier layer and in a SiCN barrier layer of the present invention, respectively. At 1 MV/cm, the leakage current is approximately 300 $\mu A/cm^2$ in a SiC barrier (FIG. 2A), compared to that of approximately 100 $nA/cm^2$ in a SiCN barrier (FIG. 2B). Thus, utilizing a SiCN barrier layer, as opposed to a SiC barrier layer, the leakage current is reduced by a factor of 3000 at an electric field of 1 MV/cm, while still maintaining the same effectiveness in preventing copper diffusion. Furthermore, the resulting SiCN layer has a relatively low dielectric constant, typically between around 5.3 and 6.3, depending on the mixture and ratio of gases used to form the SiCN.

The SiCN layer can be deposited in various ways. One suitable method involves deposition in a plasma enhanced chemical vapor deposition (PECVD) chamber. In PECVD, the desired feed gases are reacted by passing them through a plasma field. The plasma used in such processes can comprise energy derived from a variety of sources such as electric discharges, electromagnetic fields in the radio-frequency or microwave range, lasers or particle beams. The specific frequency, power, and pressure are generally adjusted for the application, wafer size, reaction chamber, etc. In PECVD reactors the coupling between the plasma and the power is capacitive, resulting in low plasma density. The combination of low plasma density and high pressure results in negligible film sputtering in PECVD deposition. In addition, those skilled in the art will understand that the rate of film deposition in PECVD processes may increase with the amount of bias power applied to the wafer.

One way of depositing SiCN using PECVD deposition involves feeding silane ($SiH_4$), methane ($CH_4$), and ammonia ($NH_3$) to the PECVD chamber. Table 1 below lists the three gases for deposition of a SiCN layer and their respective gas flow ranges, with the actual gas flow amount dependent upon the application and wafer size.

TABLE 1

| Gas | Flow Rate (sccm) |
| --- | --- |
| $SiH_4$ | 100–500 |
| $CH_4$ | 9000–12000 |
| $NH_3$ | 500–4000 |

Note that $NH_3$ flow rates of 1500 sccm and 3000 sccm both produced a SiCN layer with a measured leakage current of around 90 $nA/cm^2$ at an electric field of 1 MV/cm. It was also noted that at $NH_3$ flow rates above 4000 sccm, the resulting material started resembling a nitride, while at flow rates below 500 sccm, the resulting material behaved like silicon carbide. Table 2 below lists various process parameters and ranges for a SiCN deposition step. Note that the SiCN can be deposited using both multistation and single station deposition.

TABLE 2

| Parameter | Range |
| --- | --- |
| Pressure (Torr) | 1.0–4.0 |
| Temperature (° C.) | 300–450 |
| LF Power (kW) | 0–1 |
| HF Power (kW) | 0–1 |

Other gases can also be used for PECVD deposition, such as methylsilane ($CH_3SiH_3$), dimethylsilane ($CH_3(SiH_2)_2$), trimethylsilane ($CH_3(SiH)_3$), or tetramethylsilane ($Si(CH_3)_4$). $NH_3$ is added to the methylsilanes to create the SiCN layer. $N_2$ and $SiH_4$ may also be used to adjust the composition. The system parameters will be the same as in Table 2.

Instead of using PECVD, the SiCN layer can also be deposited using high density plasma (HDP) deposition. Feed gases of 1) $SiH_4$, $C_2H_2$, and $N_2$ or 2) $SiH_4$, $CH_4$, and $N_2$ can be used to form the SiCN layer using an HDP process. HDP chemical vapor deposition (CVD) processes typically operate at a pressure range several (two to three) orders of magnitude lower than corresponding PECVD processes (i.e., in the milliTorr range). Moreover, in an HDP reactor, power is coupled inductively, instead of capacitively, to the plasma, resulting in higher plasma density. Consequently, in an HDP reactor, because of the pressure and plasma characteristics, the atoms impinging on the depositing film surface are much more energetic than in a PECVD reactor, such that gas-solid collisions may result in sputtering of the deposited film. Another characteristic of HDP deposition is that increased bias power applied to the wafer results in an increased in situ sputter etch component, thereby decreasing the deposition rate.

The differences in the physics and chemistry of PECVD and HDP processes result in significant differences in the growth of the deposited film. For example, in PECVD processes, plasma is used to generate deposition precursors, which in turn, are driven to the wafer surface by applied bias power to the wafer. Because of the relatively high pressure of operation (on the order of 1 Torr, compared to a few milliTorr for HDP processes), the ions experience a large number of collisions. As a result, the flux of deposition precursor species to the wafer surface is distributed.

The above-described embodiments of the present invention are merely meant to be illustrative and not limiting. It will thus be obvious to those skilled in the art that various changes and modifications may be made without departing from this invention in its broader aspects. For example, the above description described the use of a silicon carbon nitride layer, which has a low leakage current and prevents metal atom migration through the SiCN layer, as a diffusion barrier for copper or metal interconnection layers. However, the properties of the SiCN layer also make such a layer suitable as an etchstop or a passivation layer for protecting the semiconductor device. An etchstop layer is used in dual damascene fabrication sequence in defining a line and a via. The passivation layer is used for protection from scratches and for protection from metal ions such as sodium. Therefore, the appended claims encompass all such changes and modifications as fall within the true spirit and scope of this invention.

We claim:

1. A semiconductor device, comprising:
   a metal portion providing electrical connection to an underlying layer;
   a silicon carbon nitride (SiCN) layer formed on at least part of the metal portion as a diffusion barrier, the SiCN layer characterized by a leakage current density that increases with an increase in an electric field from about 1.00E–10 $Amp/cm^2$ less when the electric field is about zero to about 1.6E–5 $Amp/cm^2$ when the electric field is about 2.0 MV/cm; and
   a dielectric layer overlying the SiCN layer.

2. The device of claim 1, further comprising a second SiCN layer used as a passivation layer overlying the dielectric layer.

3. The device of claim 1, wherein the SiCN layer is formed with a PECVD process.

4. The device of claim 3, wherein the SiCN layer is formed from $SiH_4$, $CH_4$, and $NH_3$ gases.

5. The device of claim 4, wherein a flow of $NH_3$ gas is less than or equal to 4000 sccm.

6. The device of claim 4, wherein a flow of $NH_3$ gas is greater than or equal to 500 sccm.

7. The device of claim 3, wherein the SiCN layer is formed from methylsilane and $NH_3$ gases.

8. The device of claim 1, wherein the SiCN layer is formed with an HDP CVD process.

9. The device of claim 8, wherein the SiCN layer is formed from $SiH_4$, $C_2H_2$, and $N_2$ gases.

10. The device of claim 8, wherein the SiCN layer is formed from $SiH_4$, $CH_4$, and $N_2$ gases.

11. The device of claim 1, wherein the metal portion is formed from copper.

12. The device of claim 1, wherein the metal portion comprises a first line portion underlying the SiCN layer and a two-step connection having a second line portion and a via portion.

13. The device of claim 12, wherein the two-step connection is formed in the dielectric layer.

14. The device of claim 13, further comprising a second SiCN layer on top of the two-step connection and the dielectric layer.

15. The device of claim 12, further comprising a second SiCN layer between the line portion and the via portion.

16. The device of claim 1, wherein the SiCN layer has a dielectric constant of between about 5.3 and about 6.3.

* * * * *